(12) United States Patent
Yao et al.

(10) Patent No.: US 9,780,012 B2
(45) Date of Patent: Oct. 3, 2017

(54) SEMICONDUCTOR DEVICE AND METHOD FOR MANUFACTURING THE SAME

(71) Applicant: FUJI ELECTRIC CO., LTD., Kawasaki (JP)

(72) Inventors: Noriaki Yao, Kanagawa (JP); Hitoshi Abe, Kanagawa (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/894,787

(22) PCT Filed: Nov. 10, 2014

(86) PCT No.: PCT/JP2014/005636
§ 371 (c)(1),
(2) Date: Nov. 30, 2015

(87) PCT Pub. No.: WO2015/087483
PCT Pub. Date: Jun. 18, 2015

(65) Prior Publication Data
US 2016/0111348 A1    Apr. 21, 2016

(30) Foreign Application Priority Data
Dec. 12, 2013  (JP) ................................. 2013-256654

(51) Int. Cl.
*H01L 23/34* (2006.01)
*H01L 29/861* (2006.01)
(Continued)

(52) U.S. Cl.
CPC ........ *H01L 23/34* (2013.01); *H01L 21/26513* (2013.01); *H01L 21/76* (2013.01);
(Continued)

(58) Field of Classification Search
CPC ... H01L 23/34; H01L 29/66; H01L 29/66348; H01L 21/26; H01L 21/26513;
(Continued)

(56) References Cited

U.S. PATENT DOCUMENTS

2002/0135037 A1    9/2002   Tomomatsu
2010/0019342 A1*   1/2010   Kawano ............... H01L 29/0619
                                                         257/494
(Continued)

FOREIGN PATENT DOCUMENTS

JP       6-117942      4/1994
JP       7-153920      6/1995
(Continued)

OTHER PUBLICATIONS

International Search Report mailed Feb. 10, 2015, in corresponding International Application No. PCT/JP2014/005636.
(Continued)

*Primary Examiner* — Fazli Erdem

(57) ABSTRACT

A semiconductor device includes: an interlayer insulating film covering: a cathode region and an anode region to form a pn junction with each other; a cathode electrode provided on the interlayer insulating film and connected to the cathode region through a first contact hole; and an anode electrode provided on the interlayer insulating film and connected to the anode region through a second contact hole. Among current paths in the cathode and anode regions, the current path in one of the cathode and anode regions that has a larger sheet resistance is shorter than the other current path, the current path in the cathode region extending from an interface of the pn junction to an end of the first contact hole closest to the interface, the current path in the anode region extending from the interface to an end of the second contact hole closest to the interface.

6 Claims, 15 Drawing Sheets

(51) Int. Cl.
  *H01L 29/868* (2006.01)
  *H01L 29/66* (2006.01)
  *H01L 21/76* (2006.01)
  *H01L 29/16* (2006.01)
  *H01L 29/739* (2006.01)
  *H01L 29/06* (2006.01)
  *H01L 21/265* (2006.01)
  *H01L 29/04* (2006.01)

(52) U.S. Cl.
  CPC .......... *H01L 29/04* (2013.01); *H01L 29/0696* (2013.01); *H01L 29/16* (2013.01); *H01L 29/66136* (2013.01); *H01L 29/66348* (2013.01); *H01L 29/7397* (2013.01); *H01L 29/861* (2013.01); *H01L 29/868* (2013.01); *H01L 2924/0002* (2013.01)

(58) Field of Classification Search
  CPC ..... H01L 29/04; H01L 29/0696; H01L 29/16; H01L 29/66136; H01L 29/7397; H01L 29/861; H01L 29/868; H01L 21/76
  See application file for complete search history.

(56) References Cited

U.S. PATENT DOCUMENTS

| 2011/0062545 | A1* | 3/2011 | Nakajima | H01L 27/0255 257/470 |
|---|---|---|---|---|
| 2014/0001472 | A1* | 1/2014 | Furukawa | H01L 21/8213 257/48 |
| 2015/0001579 | A1* | 1/2015 | Nishimura | H01L 29/66348 257/140 |
| 2016/0056144 | A1* | 2/2016 | Yao | H01L 29/66348 438/54 |

FOREIGN PATENT DOCUMENTS

| JP | 2002-190575 | 7/2002 |
|---|---|---|
| JP | 4620889 | 11/2010 |

OTHER PUBLICATIONS

International Preliminary Report on Patentability mailed Jun. 23, 2016 in corresponding International Patent Application No. PCT/JP2014/005636.

\* cited by examiner

SEMICONDUCTOR DEVICE AND METHOD FOR MANUFACTURING THE SAME

CROSS-REFERENCE TO RELATED APPLICATIONS

This application is a U.S. National Stage Application, which claims the benefit under 35 U.S.C. §371 of PCT International Patent Application No. PCT/JP2014/005636, filed Nov. 10, 2014, which claims the foreign priority benefit under 35 U.S.C. §119 of Japanese Patent Application No. 2013-256654, filed Dec. 12, 2013, the contents of which are incorporated herein by reference.

TECHNICAL FIELD

The present invention relates to a semiconductor device including a temperature sensing diode and a method for manufacturing a temperature sensing diode.

BACKGROUND ART

Some products of semiconductor devices, such as insulating gate bipolar transistors (IGBTs) and MOS field effect transistors (MOSFETs), include diodes for sensing temperature (hereinafter, referred to as temperature sensing diodes) formed on semiconductor chips.

FIG. 18 is a view illustrating a schematic configuration of a conventional temperature sensing diode 500. FIG. 18A is a plan view of the main portion, and FIG. 18B is a cross-sectional view illustrating a cross-sectional structure taken along a line III-Ill of FIG. 18A. FIG. 18A also illustrates a current path.

The conventional temperature sensing diode 500 is obtained by forming a silicon oxide film 57 on a silicon substrate 51 with semiconductor devices, such as MOSFETs, formed on the silicon substrate 51, and forming an n-type region (a cathode region) 64 and a p-type region (an anode region) 65 by impurity doping in a polysilicon layer 58 grown on the silicon oxide film 57. The temperature sensing diode 500 detects the temperature of the semiconductor chip by using the temperature characteristics of forward voltage drop Vf. A pn-junction interface 73 is located in the middle between the a first contact hole end 68a of a first contact hole 68 and a second contact hole end 69a of a second contact hole 69, the first contact hole 68 and the second contact hole 69 being formed in an interlayer insulating film 66. The pn-junction interface 73 is located at the center of an interlayer insulating film 66a sandwiched between the first contact hole 68 and the second contact hole 69.

Applying constant current I (current not larger than mA) to the temperature sensing diode 500 causes forward voltage drop Vf between the anode and cathode of the temperature sensing diode 500. The forward voltage drop Vf has the property of decreasing with an increase in temperature. The temperature sensing diode 500 is a device to detect temperature by using this property.

FIG. 19 is a diagram illustrating the relationship between the forward voltage drop Vf and temperature T in the conventional temperature sensing diode 500. When the temperature T increases from 25° C. to 150° C., Vf is decreased by about 20% to 30%. Variation of Vf causes variation of detected temperature Ts with respect to forward voltage drop Vfo which is set for detection.

Vf of the temperature sensing diode 500 is the sum of voltage Vpn generated at the pn-junction interface 73 by applying the current I and voltage (I×Rpn) generated across a parasitic resistance Rpn, which is the sum of parasitic resistances Rp and Rn of the n-type region 64 and the p-type region 65. Vpn depends on the internal potential at the pn-junction interface 73. Vf is expressed by:

$$Vf = Vpn + I \times Rpn$$

Generally, ion implantation to form the n-type region 64 and the p-type region 65 in the temperature sensing diode 500 concurrently serves as an ion implantation process to form a semiconductor device. Accordingly, the ion implantation dose, implantation energy, activation heat treatment, and the like are restricted by the process conditions to form the semiconductor devices. It is therefore difficult to control the impurity profile of the temperature sensing diode 500 alone. At the ion implantation into the polysilicon layer 58, some of the implanted impurity ions penetrate the polysilicon layer 58 by the channeling phenomenon (the range of ion implantation into polysilicon is longer than the range of ion implantation into a monocrystal). The amount of impurity ions remaining in the polysilicon layer 58 varies. The amount of impurity ions remaining in the polysilicon layer 58 is referred to as a dose herein. Because of the variation of the dose of impurity ions, variation of the parasitic resistance Rpn tends to increase.

In the case of forming the n-type region 64 by implantation of a higher dose of n-type impurity ions than the dose of p-type impurity ions to previously form the p-type region 65, the n-type impurity ions compensate the p-type impurity ions and turn the same into n-type to form the n-type region 64. The formation of the n-type region 64 therefore depends on both of the doses of p-type impurity ions and n-type impurity ions. Accordingly, the variation of sheet resistance Rsn of the n-type region 64 is larger than the variation of sheet resistance Rsp of the p-type region 65. In the n-type region 64 formed by mutual compensation of the impurity ions as described above, carriers are scattered considerably, and the sheet resistance Rsn of the n-type region 64 is therefore higher than the sheet resistance Rsp of the p-type region. These sheet resistances Rsn and Rsp constitute the aforementioned parasitic resistance Rpn, which is expressed by the following equation:

$$Rpn = Rsn \times (Ln/W) + Rsp \times (Lp/W)$$

Herein, Ln is the length of the current path in the n-type region 64. Lp is the length of the current path in the p-type region 65. W is width of the n-type region 64 and the p-type region 65. Moreover, Ln=Lp, and Ln+Lp=Lo.

Patent Literature (PTL) 1 describes a temperature sensing diode made of polysilicon in which the capacitances formed between p- and n-type regions implementing the temperature sensing diode and the substrate with the insulating layer provided just under the p- and n-type regions are set substantially equal to each other. This can prevent malfunction due to external noise.

PTL 2 discloses that the temperature sensing diode has a three-layer structure including $p^+$ layer/p layer/$n^+$ layer arranged in a planar direction.

PTL 3 discloses a structure of a temperature sensing diode in which the p- and n-type diffusion layers of the temperature sensing diode penetrate polysilicon vertically (the structure in which the diffusion layers reach the back surface of polysilicon).

PTL 4 discloses a temperature sensing diode using the change in avalanche voltage with temperature. In the temperature sensing diode, at least one of the p- and n-type regions is formed by introducing impurity ions with a dose of 5×10$^{14}$/cm$^2$ or less in order to obtain avalanche voltage that can steeply increase.

CITATION LIST

Patent Literature

PTL 1: JP4620889B2
PTL 2: JP2002-190575A
PTL 3: JP7-153920A
PTL 4: JP6-117942A

SUMMARY OF INVENTION

Technical Problem

The parasitic resistance Rpn of the temperature sensing diode 500 illustrated in FIG. 18 is expressed as a series resistance of contact resistances Rcp and Rcn, which are generated by contact between an anode electrode 72 and a polysilicon layer 58 and between a cathode electrode 71 and the polysilicon layer 58, respectively, and the resistances Rp and Rn of the p-type region 65 and the n-type region 64 formed in the polysilicon layer.

This is expressed as the following equation:

$$Rpn=Rcp+Rp+Rcn+Rn$$

Rcp and Rcn approach 0 as the areas (contact hole areas) of contact between the polysilicon layer and respective electrodes increase. For the discussion is focused on a temperature sensing diode having a large contact area, it is assumed that Rcp, Rcn=0. Accordingly, Rpn=Rp+Rn.

Herein, the sheet resistances of the n-type region 64 and the p-type region 65 are indicated by Rsn and Rsp, respectively. The lengths of the current paths in the n-type region 64 and the p-type region 65 when current is applied are indicated by Ln and Lp, respectively. The widths of the current paths are both indicated by W. The conventional structure is designed as Ln=Lp. The production errors of Ln and Lp are about ±5%. Next, Rpn will be explained.

$$Rpn=Rsp(Lp/W)+Rsn(Ln/W)=(Rsp+Rsn)\times Ln/W$$

Lp+Ln is a certain fixed length (=Lo) which is optimized by chip design rules. Herein, Lo is a distance between the first contact hole end 68a and the second contact hole end 69a, the distance equal to a distance between the ends of the interlayer insulating film 66a. The current paths Ln and Lp are distances between the pn-junction interface 73 and the first contact hole end 68a and between the pn-junction interface 73 and the second contact hole end 69a, respectively. Actually, current flows several micrometers into the cathode electrode 21 side and anode electrode 22 side from the first contact hole end 68a and the second contact hole end 69a, respectively. However, the proportions of the current are low, and it is assumed that all of the current I flows via the first contact hole end 18a and the second contact hole end 19a.

When the value and variation of Rsn are respectively larger than the value and variation of Rsp depending on the process conditions, for example, the value and variation of Rsp becomes large by the influence of the value and variation of Rsn. When the value and variation of Rpn are large under some process conditions, the influence of Rpn can degrade the accuracy of the temperature detection using Vf.

Moreover, PTLs 1 to 4 do not describe the way of improving the temperature detection accuracy of a temperature sensing diode using the temperature dependency of Vf by discussing the relationship between the lengths and sheet resistances of the p- and n-type regions implementing the temperature sensing diode.

An object of the present invention is to solve the aforementioned problem and provide a semiconductor device capable of detecting temperature with high accuracy with a temperature sensing diode using the temperature dependency of Vf and a method for manufacturing a temperature sensing diode.

Solution to Problem

In order to achieve the aforementioned object, a semiconductor device according to an aspect of the present invention includes: a cathode region which is provided on an insulating film and is made by a first conductivity-type thin-film semiconductor layer; an anode region which is provided on the insulating film to form a pn junction with the cathode region and is made by a second conductivity-type thin-film semiconductor layer; an interlayer insulating film covering the cathode and anode regions; a cathode electrode which is provided on the interlayer insulating film and is connected to the cathode region through a first contact hole penetrating the interlayer insulating film; and an anode electrode which is provided on the interlayer insulating film and is connected to the anode region through a second contact hole penetrating the interlayer insulating film. Among current paths in the cathode and anode regions, the length of the current path in one of the cathode and anode regions that has a larger sheet resistance is shorter than the length of the other current path, the current path in the cathode region extending from an interface of the pn-junction to an end of the first contact hole closest to the interface, the current path in the anode region extending from the interface to an end of the second contact hole closest to the interface.

A method for manufacturing a semiconductor device according to an aspect of the present invention includes: implanting first impurity ions into a thin-film semiconductor layer provided on an insulating film; implanting second impurity ions into a part of the thin-film semiconductor layer with the first impurity ions implanted; activating the first and second impurity ions to form an anode region in the region where the first impurity ions are implanted and form in the region where the second impurity ions are implanted, a cathode region that forms a pn junction with the anode region; forming an interlayer insulating film covering the thin-film semiconductor layer; and forming a first contact hole penetrating the interlayer insulating film to expose a part of the cathode region and forming a second contact hole penetrating the interlayer insulating film to expose a part of the anode region. The following is satisfied:

$$0.1<=(Lnx/Lpx)<=0.9$$

where Lnx is the length of a current path extending from the interface of the pn junction to an end of the first contact hole closest to the interface and Lpx is the length of a current path extending from the interface to an end of the second contact hole closest to the interface.

Advantageous Effect of Invention

According to the present invention, it is possible to improve the temperature detection accuracy of the temperature sensing diode.

DESCRIPTION OF EMBODIMENTS

Figure 1A:
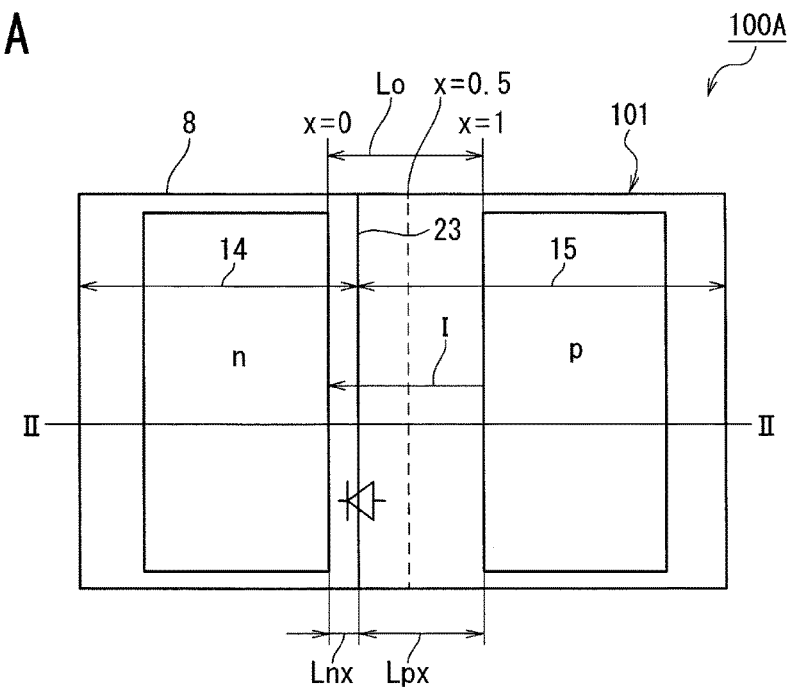
FIGS. 1A and 1B are views illustrating a schematic configuration of a semiconductor device according to a first embodiment of the present invention (FIG. 1A being a plan view of a main portion, FIG. 1B being a cross-sectional view of the main portion illustrating a cross-sectional structure taken along a line II-II).

Hereinafter, semiconductor devices according to first and second embodiments of the present invention will be explained in detail. In the following description of the embodiments, first and second conductivity types are n-type and p-type by way of example, respectively. The conductivity types may be reversed so that the first and second conductivity types are p-type and n-type, respectively. In the specification and accompanying drawings, the majority carriers in layers and regions indicated using n or p are electrons or holes, respectively. The semiconductor regions indicated using n or p accompanied with "+" and "−" have impurity concentrations higher or lower than those of the semiconductor regions indicated by n or p without + and −, respectively.

In the following description of the embodiments and the accompanying drawings, the same components are given the same reference numerals, and the redundant description of the same components is omitted. The accompanying drawings described in the embodiments are not illustrated in accurate scales and dimensional ratios for improving the visualization and understanding. The present invention is not limited to the embodiments describe below without departing from the scope of the present invention.

In the description of the semiconductor devices according to the first and second embodiments of the present invention, the thin film semiconductor layer where a temperature sensing diode is formed is a polysilicon layer for convenience. However, the thin-film semiconductor layer is not limited to a polysilicon layer and may be an amorphous semiconductor layer or the like.

First Embodiment

Figure 1B:
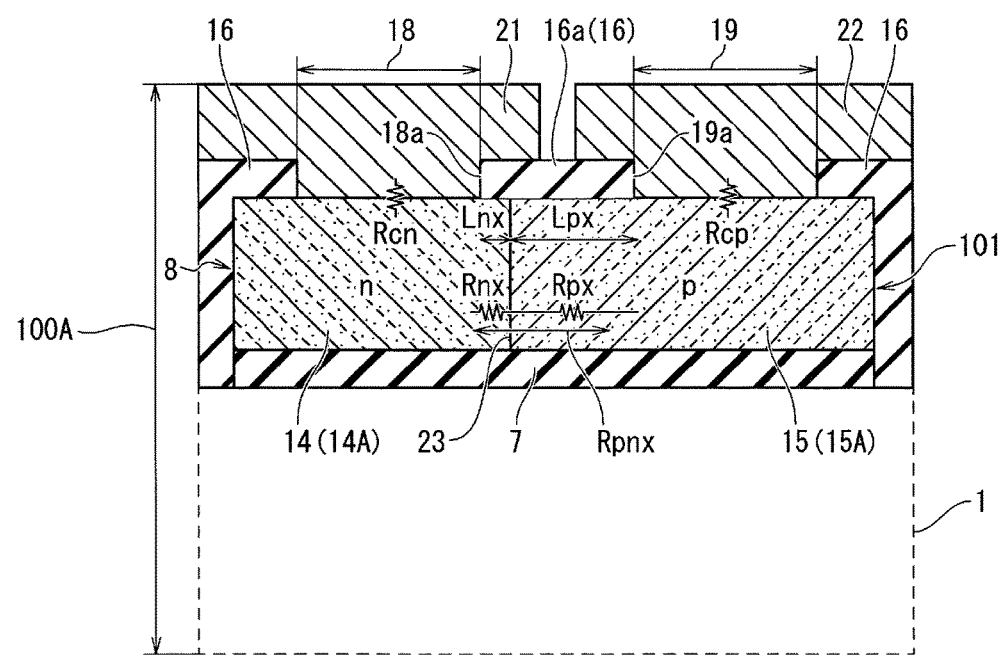

As illustrated in FIG. 1, a semiconductor device 100A according to the first embodiment of the present invention includes a temperature sensing diode 101 provided on the principal surface of a semiconductor substrate 1 of the first conductivity type (n-type) interposing an insulating film 7 between the temperature sensing diode 101 and the semiconductor substrate 1. The semiconductor substrate 1 is made of monocrystalline silicon, for example. The semiconductor device 100A according to the first embodiment includes the temperature sensing diode 101 together with power devices such as IGBTs and MOSFETs, which are not illustrated in detail.

The temperature sensing diode 101 instantly senses an abnormal rise in temperature when electricity is applied to the power devices to prevent the power devices from being broken by thermal runaway. The temperature sensing diode 101 includes a cathode region 14A and an anode region 15A. The cathode region 14A made by a thin-film semiconductor layer 14 of the first conductivity type (n-type) provided on the insulating film 7. The anode region 15A is made by a thin-film semiconductor layer 15 of the second conductivity type (p-type) which is provided on the insulating film 7 so as to form a pn junction with the cathode region 14A. The thin-film semiconductor layers 14 and 15 are formed in a polysilicon layer 8, for example. In the temperature sensing diode 101, the thin-film semiconductor layers 14 and 15 form a pn junction including an interface 23 in the planer direction.

The semiconductor device 100A according to the first embodiment includes an interlayer insulating film 16 covering the cathode region 14A and the anode region 15A of the temperature sensing diode 101. The semiconductor device 100A according to the first embodiment includes a cathode electrode 21 provided on the interlayer insulating film 16. The cathode electrode 21 is electrically and metallurgically connected to the cathode region 14A through a first contact hole 18 penetrating the interlayer insulating film 16. The semiconductor device 100A according to the first embodiment further includes an anode electrode 22 provided on the interlayer insulating film 16. The anode electrode 22 is electrically and metallurgically connected to the anode region 15A through a second contact hole 19 penetrating the interlayer insulating film 16.

The insulating film 7 and the interlayer insulating film 16 are made of silicon dioxide ($SiO_2$) film, for example. The cathode electrode 21 and the anode electrode 22 are made of aluminum (Al) film or aluminum alloy film such as aluminum silicon (Al—Si) film, aluminum copper (Al—Cu) film, or aluminum copper silicon (Al—Cu—Si) film.

The pn-junction interface 23 of the temperature sensing diode 101 is located just under an inter-contact hole portion 16a of the interlayer insulating film 16 between the first contact hole 18 and the second contact hole 19.

The side and bottom surfaces of the cathode region 14A and the anode region 15A are covered with the interlayer insulating film 16 and the insulating film 7. The semiconductor device 100A according to the first embodiment described herein includes one temperature sensing diode 101 for convenience. However, in some cases, the semiconductor device 100A includes a plurality of temperature sensing diodes connected in series to increase detected voltage. In such cases, the entire structure including the plurality of temperature sensing diodes serves as the temperature sensing diode, and individual temperature sensing diodes serve as temperature sensing diode units.

The lengths of current paths in the cathode region 14A and the anode region 15A, which implement the temperature sensing diode 101, are defied as $Lnx$ and $Lpx$, respectively. The current path lengths $Lnx$ and $Lpx$ are respectively lengths of the sections located in the cathode region 14A and the anode region 15A among the current path length $Lo$ from a first contact hole end 18a to a second contact hole end 18b. When the temperature sensing diode 101 includes one pn-junction interface 23 as illustrated in FIG. 1, $Lnx$ and $Lnp$ are distances between the pn-junction interface 23 and the first contact hole end 18a or the second contact hole end 19a (the distance between each end of the inter-layer insulating film and the pn junction), respectively. Moreover, $Lnx+Lpx$ is the length $Lo$ of the current path from the first contact hole end 18a to the second contact hole end 19a and is a constant length optimized in accordance with the chip design rules.

Herein, the ratio of the length $Lnx$ of the current path in the cathode region 14A to the current path $Lo$ is referred to as $x$. When the temperature sensing diode 101 includes one pn-junction interface 23 as illustrated in FIG. 1, $x$ indicates the position of the pn-junction interface 23. Specifically, $x=0$ indicates that the pn-junction interface 23 is located at the position of the first contact hole end 18a, and $x=1$ indicates that the pn-junction interface 23 is located at the end of the second contact hole 19 (the second contact hole end 19a) formed on the anode region 15A. Accordingly, $Lnx$ and $Lpx$ are expressed by using $Lo$ as $Lnx=Lo \times x$ and $Lpx=Lo \times (1-x)$. In the conventional structure, $x=0.5$, and $Lnx(x=0.5)=Ln$, and $Lpx(x=0.5)=Lp$.

The parasitic resistance of the temperature sensing diode 101, which is indicated by $Rpnx$, is expressed as $Rpnx=Rnx+Rpx$ if it is assumed that contact resistances between the cathode electrode 21 and cathode region 14A and between the anode electrode 22 and anode region 15A are negligible. Herein, $Rnx$ and $Rpx$ are the resistances of the current paths in the cathode region 14A and the anode region 15A, respectively. Moreover, the parasitic resistance $Rpnx$ of the temperature sensing diode 101 is expressed by:

$$Rpnx=Rsn(Lnx/W)+Rsp(Lpx/W)$$

where $Rsn$ and $Rsp$ are sheet resistances of the cathode region 14A and the anode region 15A, respectively. $Lnx$ and $Lpx$ are lengths of current paths in the cathode region 14A and the anode region 15A, respectively. $W$ is the width of the current paths.

The specific numerical values of the specifications are as follows in the first embodiment, for example, $Lo=Lnx+Lpx=30$ μm, $Rsn=400\Omega/\square$, and $Rsp=150\Omega/\square$.

Figure 2:
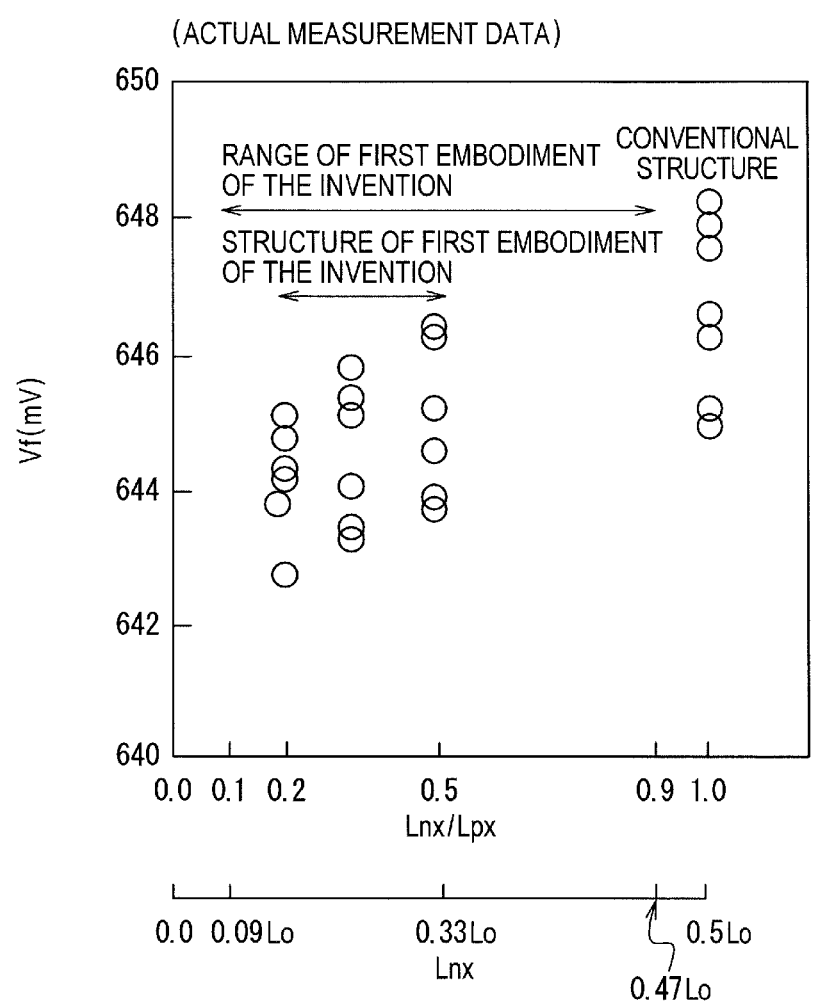
FIG. 2 is a diagram illustrating variations of the value of forward voltage drop Vf in the semiconductor device according to the first embodiment of the present invention.
Figure 3:
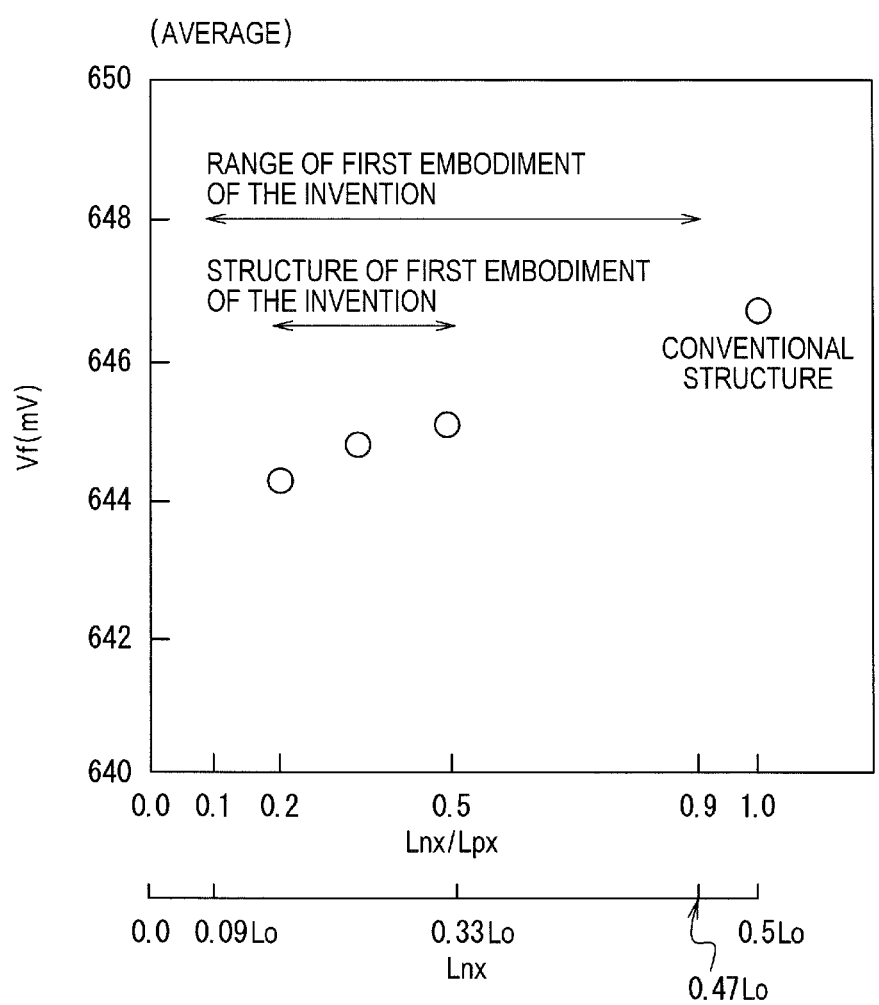
FIG. 3 is a diagram illustrating averages of the forward voltage drop Vf in the semiconductor device according to the first embodiment of the present invention.
Figure 4:
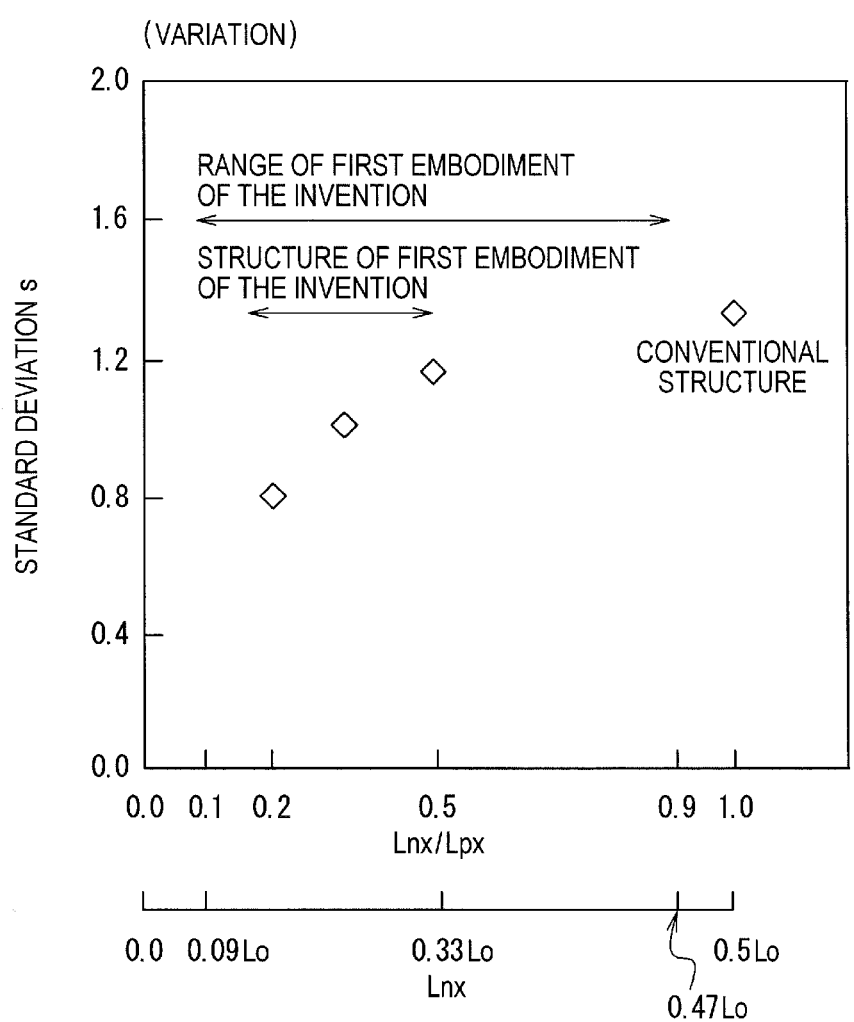
FIG. 4 is a diagram illustrating standard deviations s of the forward voltage drop Vf in the semiconductor device according to the first embodiment of the present invention.

FIGS. 2 to 4 are diagrams illustrating the relationship between the value and variation of the forward voltage drop $Vf$ and $Lnx/Lpx$. FIG. 2 is a diagram illustrating variations in value of the forward voltage drop $Vf$. FIG. 3 is a diagram illustrating averages of the forward voltage drop $Vf$. FIG. 4 is standard deviations s of the forward voltage drop $Vf$.

These diagrams reveal that the variation of the forward voltage drop $Vf$ decreases as the current path length $Lpx$ of the p-type anode region 15A having a low sheet resistance increases. Specifically, when $Lnx/Lnp$ is decreased from 1 (the conventional structure) to 0.2 where $Lnx+Lpx=Lo$ (constant), the value of $Vf$ is decreased by about 3 mV, and the standard deviation representing the variations in $Vf$ is decreased by almost half from 1.4 to 0.8.

When the value of $Rsn$ is larger than the value of $Rsp$ depending on some process conditions, the value of $Rpnx$ can be decreased by satisfying $0.1<=Lnx/Lpx<=0.9$. When $Lnx/Lpx$ is higher than 0.9, the structure is close to the conventional structure, and the effectiveness of decreasing the value of $Rpnx$ is small. On the other hand, when $Lnx/Lpx$ is lower than 0.1, the pn-junction interface 23 is too close to the cathode electrode 21, and the depletion layer of the temperature sensing diode 101 reaches the cathode electrode 21, so that the temperature sensing diode 101 cannot produce correct temperature dependence of $Vf$. Accordingly, when $Rsn>Rsp$, $Lnx$ and $Lpx$ are preferably set to satisfy the range of $0.1<=Lnx/Lpx<=0.9$. On the other hand, when $Rsn<Rsp$, $Lnx$ and $Lpx$ are preferably set to satisfy the range of $0.1<=Lpx/Lnx<=0.9$.

When the above range is expressed as the range of $Lnx$, $0.1<=Lnx/(Lo-Lnx)<=0.9$, and $0.1(Lo-Lnx)<=Lnx<=0.9(Lo-Lnx)$. Accordingly, $(0.1/1.1)Lo<=Lnx<=(0.9/1.9)Lo$, and therefore, $0.09Lo<=Lnx<=0.47Lo$ in the case of $Rsn>Rsp$. In the case of $Rsn<Rsp$, $Lpx$ may be set to satisfy $0.09Lo<=Lpx<=0.47Lo$.

In the later-described manufacturing method illustrated in FIGS. 8 to 14, the value of $Rsn$ is larger than the value of $Rsp$, and the variation of $Rsn$ is larger than the variation of $Rsp$. Accordingly, when $Lnx/Lpx$ is set in the aforementioned range, the variation of $Rpnx$ is decreased, and the variation of $Vf$ is therefore decreased.

In the above description, the value and variation of $Rsn$ are larger than the value and variation of $Rsp$. When the value and variation of $Rsp$ are larger than the value and variation of $Rsn$, the value and variation of $Rpnx$ can be decreased by setting $Lpx/Lnx$ in a range of $0.1<=Lpx/Lnx<=0.9$.

As described above, when the value of Rpnx is decreased, the proportion of Rpnx in Vf is decreased. Accordingly, Vf is determined by voltage Vpn generated at the pn-junction interface 23, and Rpnx less influences on Vf. It is therefore possible to improve the temperature detection accuracy of the temperature sensing diode 101 more easily than the conventional structure. Herein, Vpn is the threshold voltage of Vf concerning the built-in potential at the pn-junction interface 23 and is a value obtained by subtracting a voltage drop caused by Rpnx from Vf.

By decreasing the variation of Rpnx, the variation of Vf can be decreased, thus improving the temperature detection accuracy of the temperature sensing diode 101.

Figure 5:
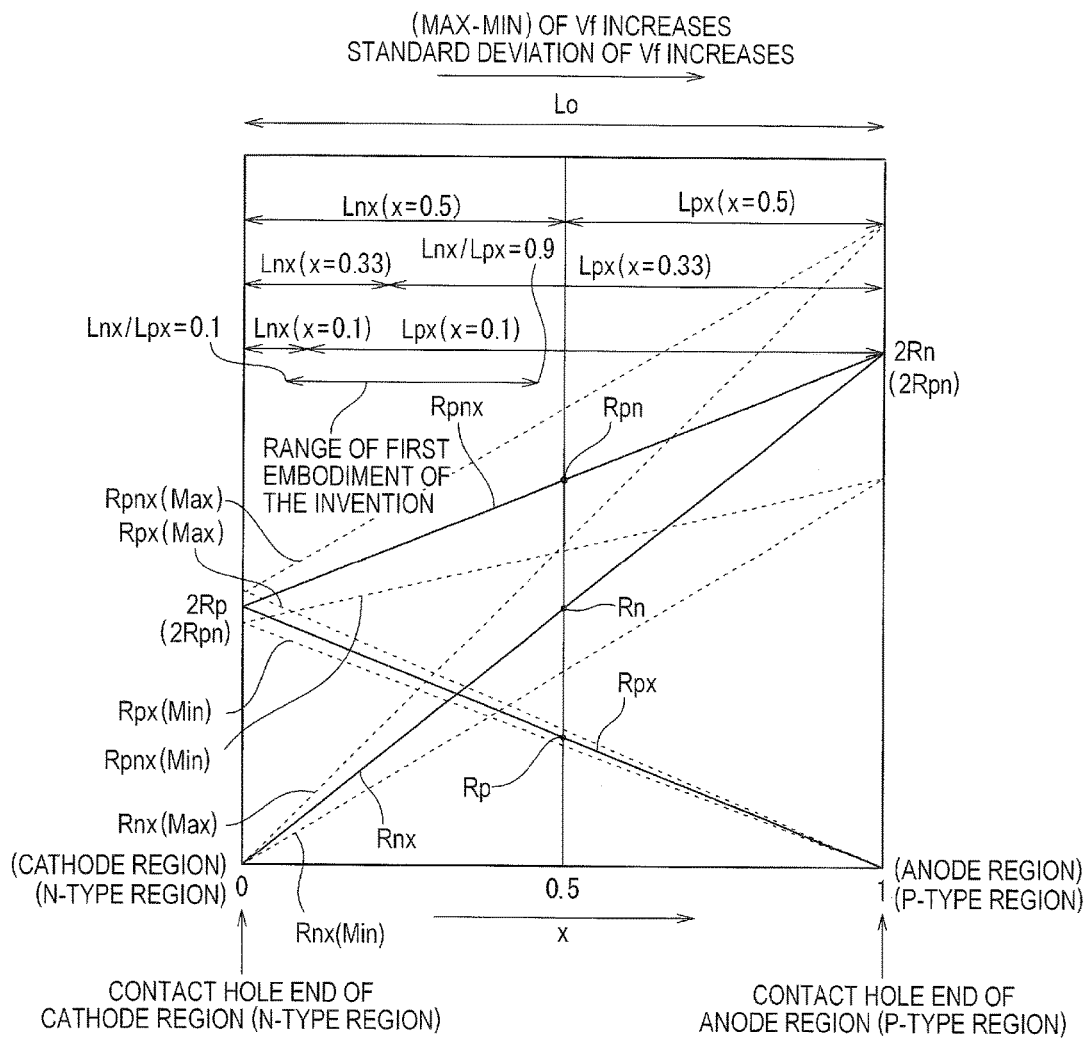
FIG. 5 is a diagram illustrating the relationship between resistances and distance x in the semiconductor device according to the first embodiment of the present invention.
Figure 6:
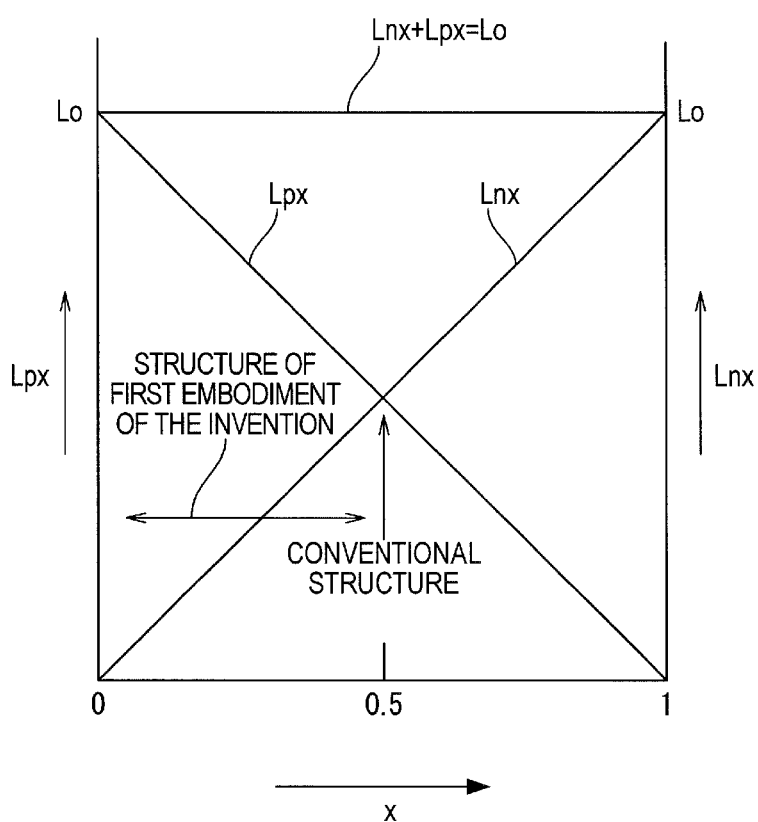
FIG. 6 is a diagram illustrating the relationship between Lnx, Lpx and the distance x in the semiconductor device according to the first embodiment of the present invention.

FIG. 5 is a diagram illustrating the relationship between the resistances and distance x for explaining the first embodiment. The resistances include Rpnx, Rnx, Rpx, Rpnx (Max), Rpnx(Min), Rnx(Max), Rnx(Min), Rpx(Max), and Rpx(Min). Herein, Max and Min indicate the maximum and minimum values, and the resistances without parentheses ( ) indicate averages. x indicates the distance from the first contact hole end 18a to the pn-junction interface 23. As x increases, Rpnx increases. FIG. 6 is a diagram illustrating the relationship between the distance x and Lnx, Lpx.

Figure 18A:
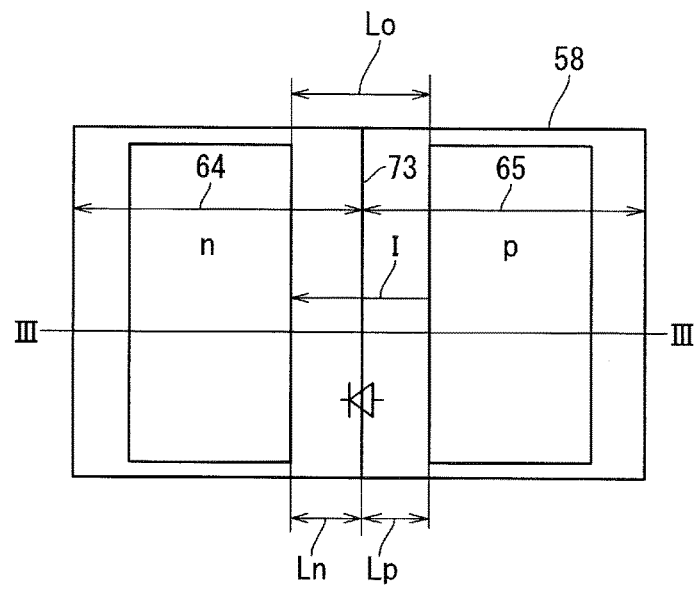
FIGS. 18A and 18B are views illustrating a schematic configuration of a conventional temperature sensing diode (FIG. 18A being a plan view of the main portion, FIG. 18B being a cross-sectional view of the main portion illustrating a cross-sectional structure taken along a line III-III).
Figure 18B:
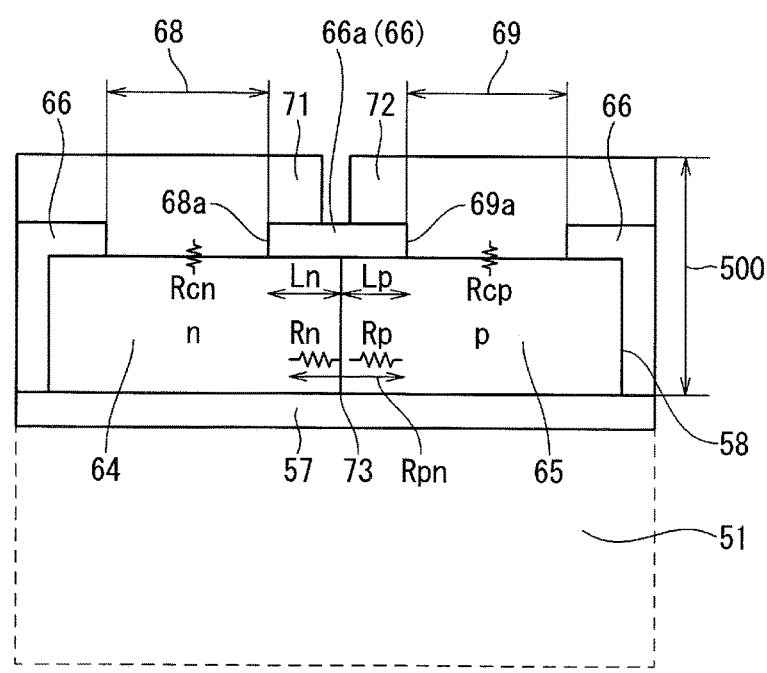
Figure 19:
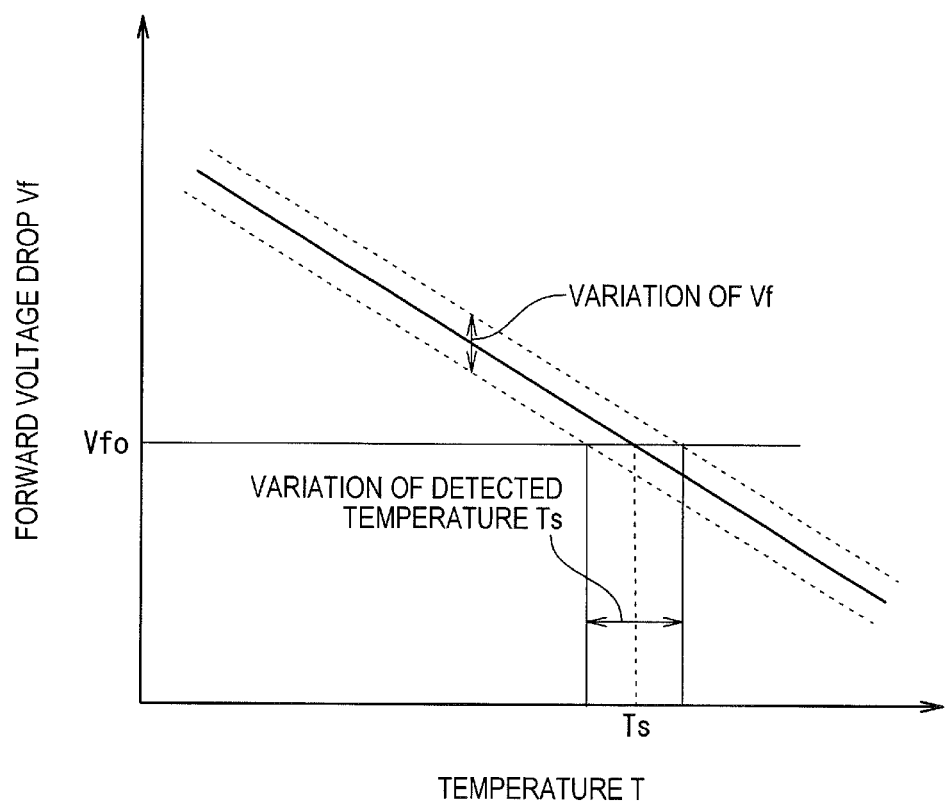
FIG. 19 is a diagram illustrating the relationship between forward voltage drop Vf and temperature in the conventional temperature sensing diode.

Horizontal axes of FIGS. 5 and 6 show x, that is, the distance from the first contact hole end 18a to the pn-junction interface 23 in the cathode region 14A. The distance x=1 corresponds to Lo. Moreover, Lnx and Lpx are lengths of the current paths at the distance x. For example, when x=0, Lnx(x=0)=0, and Lpx(x=0)=Lo. When x=1, Lnx(x=1)=Lo, and Lpx(x=1)=0. In the conventional structure illustrated in FIG. 18, x=0.5, and Rpnx(x=0.5)=Rpn, Rnx(x=0.5)=Rn, Rpx(x=0.5)=Rp, Lnx(x=0.5)=Ln, and Lpx(x=0.5)=Lp.

With reference to FIGS. 5 and 6, the resistances and lengths are expressed as:

$$Lnx=Lo \times x,$$

$$Lpx=Lo-Lo \times x,$$

$$Rnx=(2Rn) \times x,$$

$$Rpx=(1-x) \times (2Rp), \text{ and}$$

$$Rpnx=Rnx+Rpx$$

where x is a numerical value ranging from 0 to 1.

First, the value of Rpnx(x=0.5) of the conventional structure is described. Herein, Rpnx(x=0.5)=Rpn.

Since x=0.5 in the conventional structure, $$Lnx(x=0.5)=0.5Lo, \text{ and}$$

$$Lpx(x=0.5)=0.5Lo. \text{ Moreover,}$$

$$Rpnx(x=0.5)=Rnx(x=0.5)+Rpx(x=0.5)=0.5 \times 2Rn+0.5 \times 2Rp=0.5 \times 2(Rn+Rp)=Rn+Rp. \text{ When } Rn=2Rp,$$

$$Rpnx(x=0.5)=Rn+Rp=2Rp+Rp=3Rp.$$

On the other hand, in the case of the first embodiment, when x=0.1, for example, $$Lnx(x=0.1)=0.1Lo, \text{ and}$$

$$Lpx(x=0.1)=Lo-0.1Lo=0.9Lo. \text{ Moreover,}$$

$$Rpnx(x=0.1)=Rnx(x=0.1)+Rpx(x=0.1)=0.1 \times 2Rn+0.9 \times 2Rp. \text{ When } Rn=2Rp,$$

$$Rpnx(x=0.1)=0.1 \times 2Rn+0.9 \times 2Rp=0.1 \times 2 \times 2Rp+0.9 \times 2Rp=0.4Rp+1.8Rp=2.2Rp.$$

In other words, the length Lnx of the current path in the cathode region 14A is decreased to 20% of that of the conventional structure (=0.1÷0.5×100), Rpnx is decreased from 3Rp to 2.2Rp. The parasitic resistance Rpnx can be decreased to about 70% (=2.2÷3×100) of that of the conventional structure.

The above discussion also applies to the variation of Rpnx. This is because the variations in sheet resistances Rsn and Rsp tend to increase with increases in Rsn and Rsp. Accordingly, by shortening the length Lnx of the current path in the cathode region 14A having a large resistance, the value and variation of Rpnx can be decreased. The variation of Vf can be smaller than the variation of the conventional structure, thus improving the temperature detection accuracy of the temperature sensing diode 101.

To understand the image of the invention more specifically, the first embodiment is described in detail with convenient numerical values in detail.

First, the case of the conventional structure where Lnx(x=0.5)/Lpx(x=0.5)=Lo/Lo=1 will be explained. The following numeral values are used by way of example for convenience.

The maximum value of Rnx(x=0.5) is 120Ω, the minimum value of Rnx(x=0.5) is 80Ω, the maximum value of Rpx(x=0.5) is 50Ω, and the minimum value of Rpx(x=0.5) is 50Ω where Lo=30 μm, Lnx(x=0.5)=15 μm, Lpx(x=0.5)=15 μm, W=15 μm, Rsn=100Ω/□, variation=±20%, Rsp=50Ω/□, and variation=0%.

Rpnx(x=0.5) is calculated as:

$$Rpnx(x=0.5)=Rnx(x=0.5)+Rpx(x=0.5)$$

$$=100\Omega+50\Omega$$

$$=150\Omega$$

Next, the variation of Rpnx(x=0.5) is calculated:

Maximum value(Max) of $Rpnx(x=0.5)$=maximum value (Max) of $Rnx(x=0.5)$+maximum value (Max) of $Rpx(x=0.5)$ $$=120\Omega+50\Omega$$

$$=170\Omega$$

Minimum value(Min) of $Rpnx(x=0.5)$=minimum value (Min) of $Rnx(x=0.5)$+minimum value (Min) of $Rpx(x=0.5)$ $$=80\Omega+50\Omega$$

$$=130\Omega$$

Herein, the variation of Rpnx(x=0.5) is expressed by the maximum value of Rpnx(x=0.5)–the minimum value of Rpnx(x=0.5). The variation is therefore 170Ω–130Ω=40Ω.

On the other hand, the case where Lnx(x=0.33)/Lpx(x=0.33)=0.5 will be explained as an example of the present invention.

When Lo=30 μm, Lnx(x=0.33)=10 μm, Lpx(x=0.33)=Lo–Lnx(x=0.33)=30 μm–10 μm=20 μm, W=15 μm, Rsn=100Ω/□ (variation=±20%), and Rsp=50Ω/□ (variation=0%), Rnx(x=0.33)=100×10/15=67Ω.

The maximum value of Rnx(x=0.33) is 67×1.2=80Ω, the minimum value of Rnx(x=0.33) is 67×0.8=54Ω, the maximum value of Rpx(x=0.33)=the minimum value of Rpx(x=0.33) is 50×20/15=67Ω.

Rpnx(x=0.33) is calculated as:

$$Rpnx(x=0.33)=67\Omega+67\Omega=134\Omega$$

Next, the variation of Rpnx(x=0.33) is calculated as:

Maximum value (Max) of $Rpnx(x=0.33)=80\Omega+67\Omega=147\Omega$

Minimum value (Min) of $Rpnx(x=0.33)=54\Omega+67\Omega=121\Omega$

Herein, the variation of Rpnx(x=0.33) is expressed by the maximum value of Rpnx(x=0.33)−the minimum value of Rpnx(x=0.33). The variation is therefore 147Ω−121Ω=26Ω.

As described above, in comparison between Rpnx (x=0.33) and Rpnx(x=0.5), the value of Rpnx is decreased from 150Ω to 134Ω, and the variation is decreased from 40Ω to 26Ω.

Vpn (the threshold voltage of the pn-junction interface 23) constituting Vf does not change even if the location of the pn-junction interface 23 moves. In other words, Vpn does not change even if the value of x changes. Accordingly, Vf changes with the variation of voltage drop by Rpnx.

When the applied current I is 0.1 mA, the voltage drop by Rpnx(x=0.5) is 40Ω×0.1 mA=4 mV, and the voltage drop by Rpnx(x=0.33) is 26Ω×0.1 mA=2.6 mV. The variation of Vf is decreased from 4 mV to 2.6 mV.

This means that the variation of Vf is decreased by 1.4 mV (=4 mV−2.6 mV). The larger the above decrease, the higher the effectiveness of decreasing the variation compared with the conventional structure.

When the applied current I is larger than 0.1 mA, the decrease in variation of Vf becomes larger than 1.4 mV. For example, when I=1 mA, the decrease in the variation of Vf can be increased to 14 mV. The larger the applied current I, the larger the improvement in temperature detection accuracy compared with the conventional structure.

In above description, the resistance of the region having a larger sheet resistance is decreased by adjusting the lengths of current paths, which are the distances Lpx and Lnx between the pn-junction interface 23 and the respective contact hole end 18a and contact hole end 18b. However, the resistance of the region having a larger sheet resistance can be decreased by increasing the cross-sectional area of the current path. In this case, the width of the region having a larger sheet resistance is increased while the contact hole is widened so that the current can spread in the region of interest. When the contact resistances between the cathode electrode 21 and the cathode region 14A and between the anode electrode 22 and the anode region 15A are large, Rpnx becomes large because of the contact resistances, but the technique of the semiconductor device 100A according to the first embodiment of the present invention remains effective.

Second Embodiment

Figure 7:
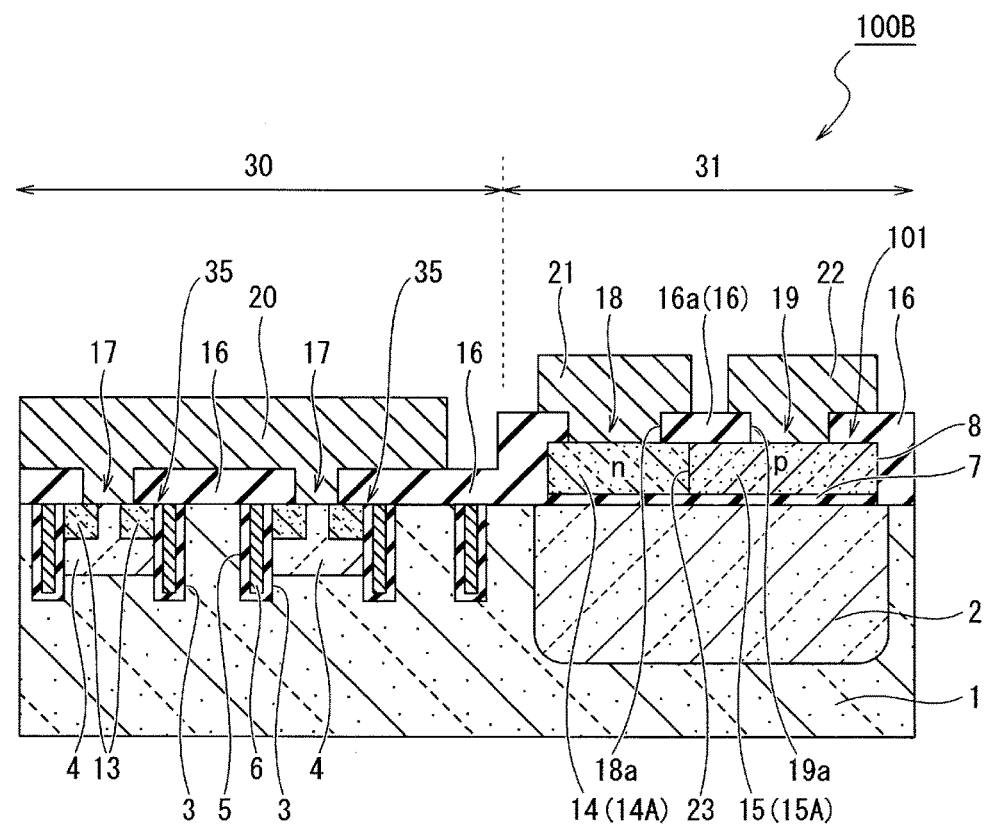
FIG. 7 is a cross-sectional view illustrating a schematic configuration of a main portion of a semiconductor device according to a second embodiment of the present invention.

As illustrated in FIG. 7, a semiconductor device 100B according to a second embodiment of the present invention is made by a semiconductor substrate 1 as a main body. The semiconductor substrate 1 includes an active region 30 concerning main current and an inactive region 31 in a central part of the principal surface of the semiconductor substrate 1. The semiconductor substrate 1 includes an edge region (not illustrated) which is in a peripheral section surrounding the active region 30 and is related to breakdown voltage reliability. The inactive region 31 is located between the active region 30 and edge region.

In the active region 30, a power MOSFET is provided as a power device. On the inactive region 31, the temperature sensing diode 101 is provided so as to interpose an insulating film 7 between the temperature sensing diode 101 and the inactive region 31. The power MOSFET, which is not illustrated in detail, has a structure in which a plurality of transistor cells 35 made by micro-pattern MOSFETs are electrically connected in parallel to provide high power. FIG. 7 illustrates two transistor cells 35.

Each transistor cell 35 is mainly made by trenches 3, gate insulating films 5, gate electrodes 6, a second conductivity-type (p-type) channel formation region 4, source regions 13, and a drain region. The trenches 3 extend from the principal surface of the semiconductor substrate 1 in the depth direction. The gate insulating films 5 are formed along the inner walls of the trenches 3 and are made of $SiO_2$ film, for example. The gate electrodes 6 are embedded in the respective trenches 3 interposing the gate insulating films 5 between the respective trenches 3 and the gate electrodes 6 and are each made of a polysilicon layer doped with impurities to lower the resistance value, for example. The channel formation region 4 is provided between the trenches adjacent to each other in the surface layer section of the semiconductor substrate 1. The source regions 13 are made by a first conductivity-type ($n^+$-type) semiconductor region provided in the surface layer section of the channel formation region 4. The drain region, which is not illustrated in detail, is made by the semiconductor substrate 1 and a first conductivity-type ($n^+$-type) semiconductor region provided on the back surface of the semiconductor substrate 1.

In the inactive region 31 of the semiconductor substrate 1, a second conductivity-type (p-type) diode protection region 2 is provided to protect the temperature sensing diode 101 from the electric field of the power MOSFETs.

Herein, the field effect transistors (FETs) are not limited to MOS transistors in which the gate insulating film is made by oxide film and may be more common MIS transistors in which the gate insulating film is made by another type of insulating film such as silicon nitride film ($Si_3N_4$) or insulating film such as a laminated film of such insulating film, including silicon nitride film ($Si_3N_4$), and oxide film.

The temperature sensing diode 101 instantly senses an abnormal rise in temperature when electricity is applied to the power MOSFETs to prevent the power devices from being broken by thermal runaway. The temperature sensing diode 101 includes a cathode region 14A and an anode region 15A. The cathode region 14A includes a first conductivity type (n-type) thin-film semiconductor layer 14 provided on an insulating film 7. The anode region 15A includes a second conductivity type (p-type) thin-film semiconductor layer 15 which is provided on the insulating film 7 so as to form a pn junction with the cathode region 14A. The thin-film semiconductor layers 14 and 15 are made by a polysilicon layer 8 provided on the insulating film 7, for example. In the temperature sensing diode 101, the thin-film semiconductor layers 14 and 15 form a pn-junction including a pn-junction interface 23 in the planer direction.

The cathode region 14A and the anode region 15A are covered with an interlayer insulating film 16 provided on the principal surface of the semiconductor substrate 1. A cathode electrode 21 is provided on the interlayer insulating film 16 and is electrically and mechanically connected to the cathode region 14A through a first contact hole 18, which penetrates the interlayer insulating film 16. An anode electrode 22 is provided on the interlayer insulating film 16 and is electrically and mechanically connected to the anode region 15A through a second contact hole 19, which penetrates the interlayer insulating film 16. The pn-junction interface 23 of the temperature sensing diode 101 is located in the polysilicon layer 8 just under an inter-contact hole portion 16a of the interlayer insulating film 16 between the first contact hole 18 and the second contact hole 19.

The channel formation regions 4 and the source regions 13 are provided on the interlayer insulating film 16 and are electrically and mechanically connected to a source electrode 20 through a third contact hole 17 which penetrates the interlayer insulating film 16.

Next, a method for manufacturing the semiconductor device 100B according to the second embodiment will be explained with reference to FIGS. 8 to 14.

Figure 8:
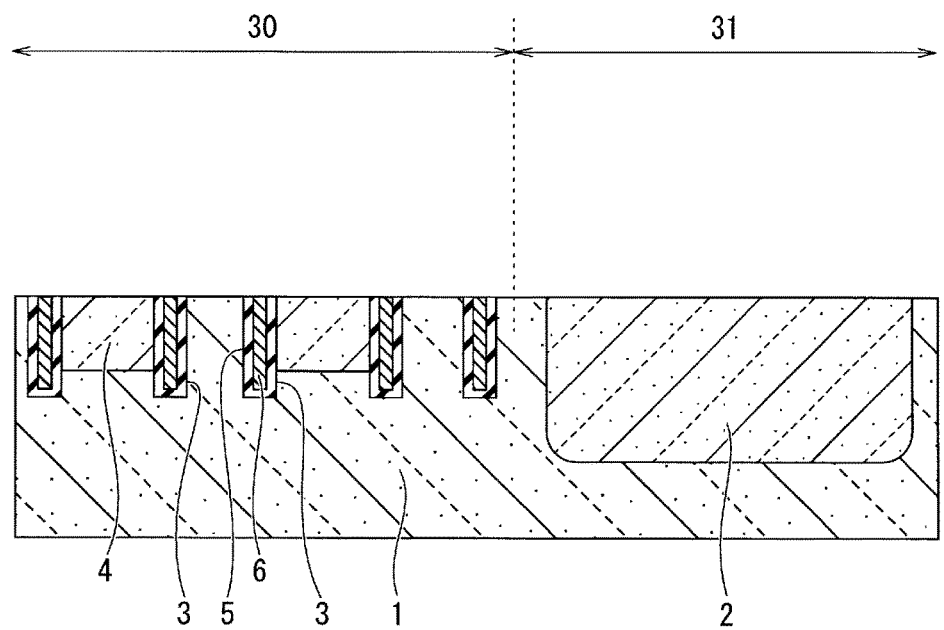
FIG. 8 is a cross-sectional view of the main portion for explaining a method for manufacturing the semiconductor device according to the second embodiment of the present invention.

First, the semiconductor substrate 1 illustrated in FIG. 8 is prepared, and the trenches 3 extending from the principal surface of the semiconductor substrate 1 as a drift layer in the depth direction is formed by dry etching. After the gate insulating film 5 is then formed, the trenches 3 are filled with the polysilicon layer, which is to serve as the gate electrode 6, interposing the gate insulating film 5 between the gate electrode 6 and the trenches 3. Next, the polysilicon layer and gate insulating film 5 on the principal surface of the semiconductor layer 1 are etched back and selectively removed. In the active region 30 in the principal surface of the semiconductor substrate 1, each of the channel formation regions 4 is formed between the trenches 3 adjacent to each other. Subsequently, the diode protection region 2 is formed in the inactive region 31 of the principal surface of the semiconductor substrate 1. These diode protection region 2 and channel formation regions 4 are formed to a predetermined depth of diffusion by selectively forming each impurity ion implanted layer through ion implantation using photoresist as a mask into a predetermined pattern and then performing heat treatment to activate impurity ions in the ion implanted layers. As a result, in the region where the temperature sensing diode 101 is intended to be formed, the diode protection region (well region) 2 is formed with a depth of about 8 µm.

Figure 9:
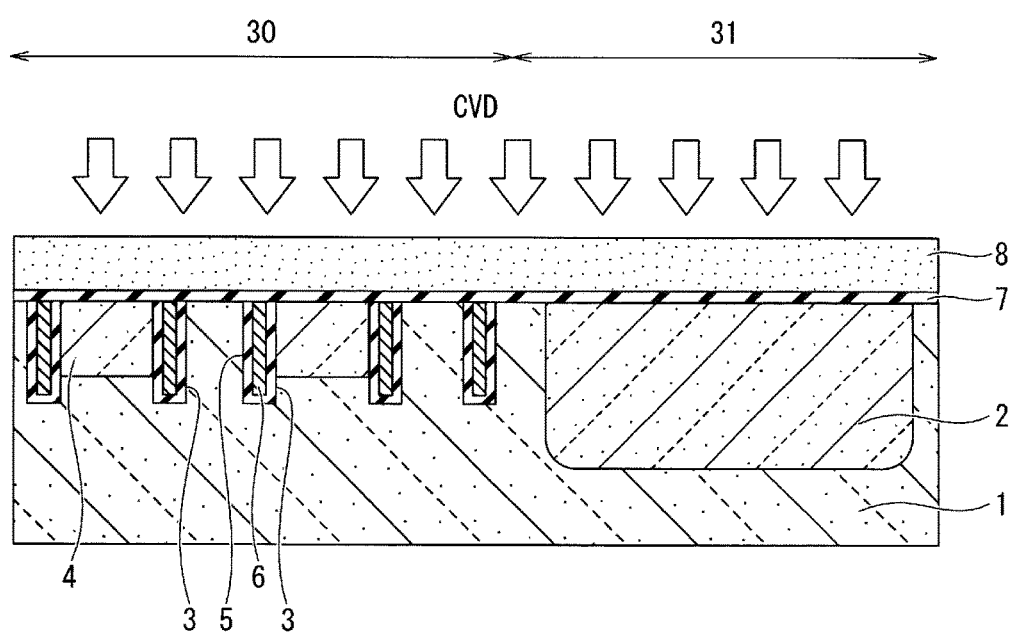
FIG. 9 is a cross-sectional view of the main portion for explaining the method for manufacturing the semiconductor device according to the second embodiment of the present invention.

Next, as illustrated in FIG. 9, the insulating film 7, which is made of oxide film such as high-temperature silicon oxide (HTO) film with a thickness of about 300 nm, for example, is formed on the entire principal surface of the semiconductor substrate 1. Thereafter, on the insulating film 7, the non-doped polysilicon layer 8 with a thickness of 500 nm, for example, is formed by chemical vapor deposition (CVD).

Figure 10:
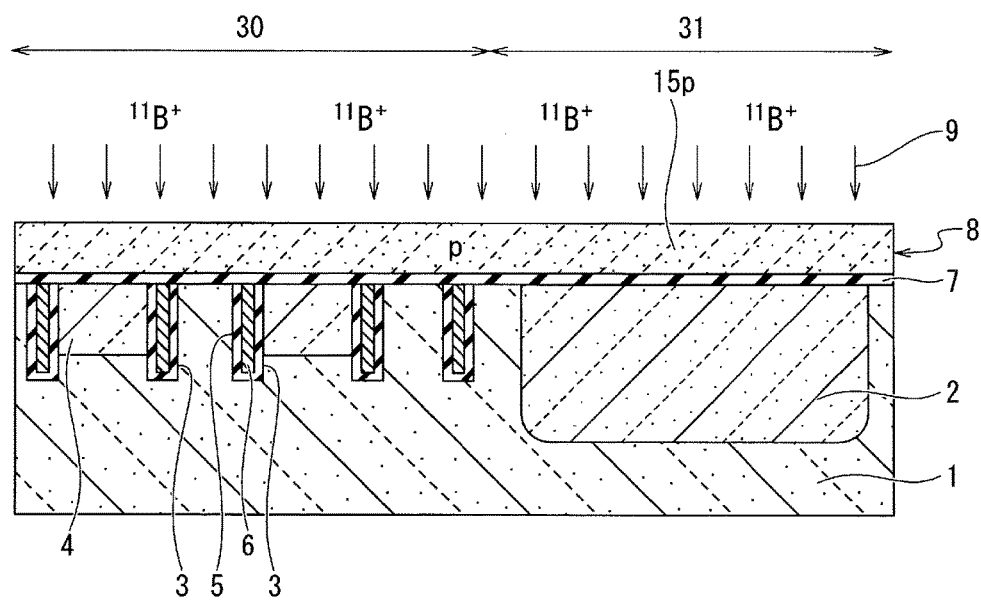
FIG. 10 is a cross-sectional view of the main portion for explaining the method for manufacturing the semiconductor device according to the second embodiment of the present invention.

Next, as illustrated in FIG. 10, boron ions ($^{11}B^+$) 9, for example, are implanted as first impurity ions into the entire surface of the polysilicon layer 8 to form an impurity ion implanted layer 15p all over the polysilicon layer 8. The implantation of the boron ions ($^{11}B^+$) 9 is performed under the conditions of a dose of $2\times10^{14}$ cm$^{-2}$ and an acceleration energy of about 45 keV, for example.

Figure 11:
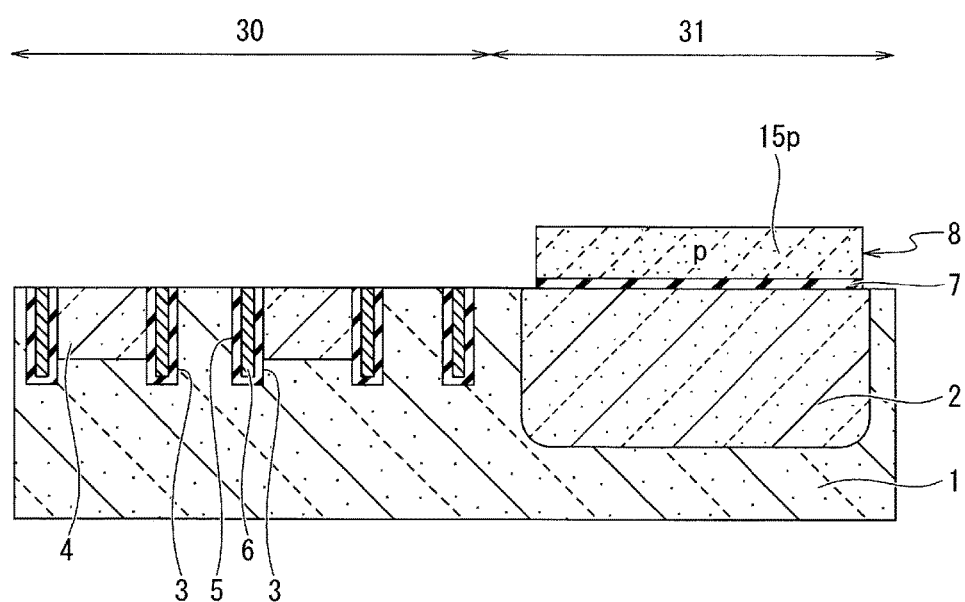
FIG. 11 is a cross-sectional view of the main portion for explaining the method for manufacturing the semiconductor device according to the second embodiment of the present invention.

Next, by using photoresist as an etching mask (not illustrated), the polysilicon layer 8 and the insulating film 7 are selectively removed by dry etching leaving part of the polysilicon layer 8 and the insulating film 7 provided on the diode protection region 2. The photoresist is then removed, as shown in FIG. 11.

Figure 12:
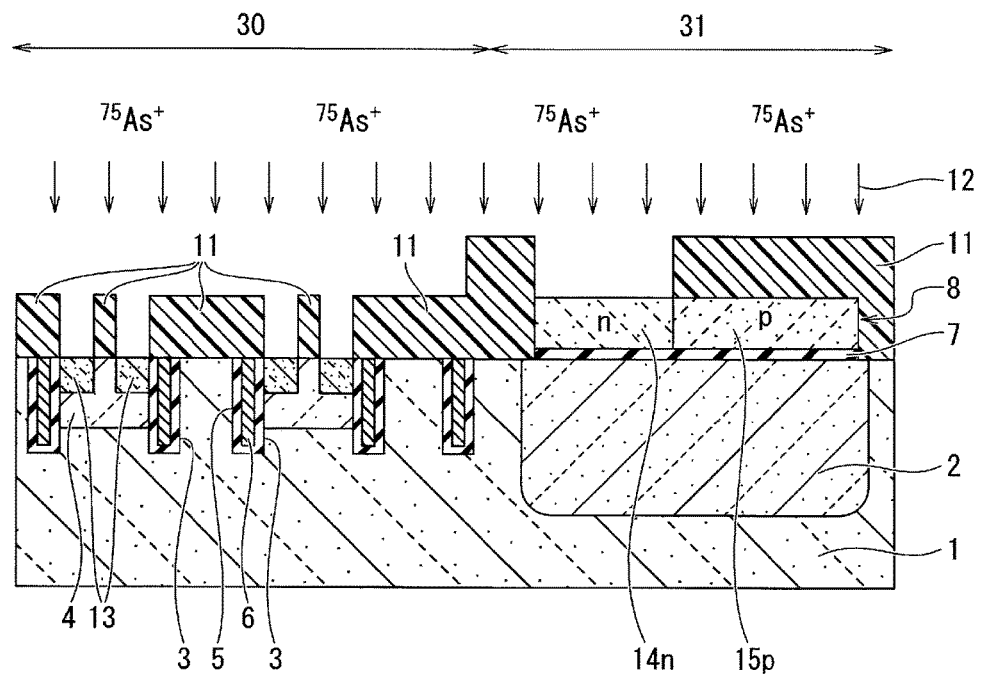
FIG. 12 is a cross-sectional view of the main portion for explaining the method for manufacturing the semiconductor device according to the second embodiment of the present invention.

Next, as illustrated in FIG. 12, by using photoresist 11 as an ion implantation mask, arsenic ions (75As$^+$), for example, are selectively implanted as second impurity ions exhibiting the n-type conductivity into the active region 30 in the principal surface of the semiconductor substrate 1 and an impurity ion implantation layer 8p of the polysilicon layer 8 to form impurity ion implantation layers 13n in the active region 31 of the semiconductor substrate 1 and also selectively form an impurity ion implantation layer 14n in a part of an impurity ion implantation layer 15p. The implantation of the arsenic ions ($^{75}As^+$) 12 is performed under the conditions of a dose of $5\times10^{15}$ cm$^{-2}$ and an acceleration energy of about 120 keV, for example.

Figure 13:
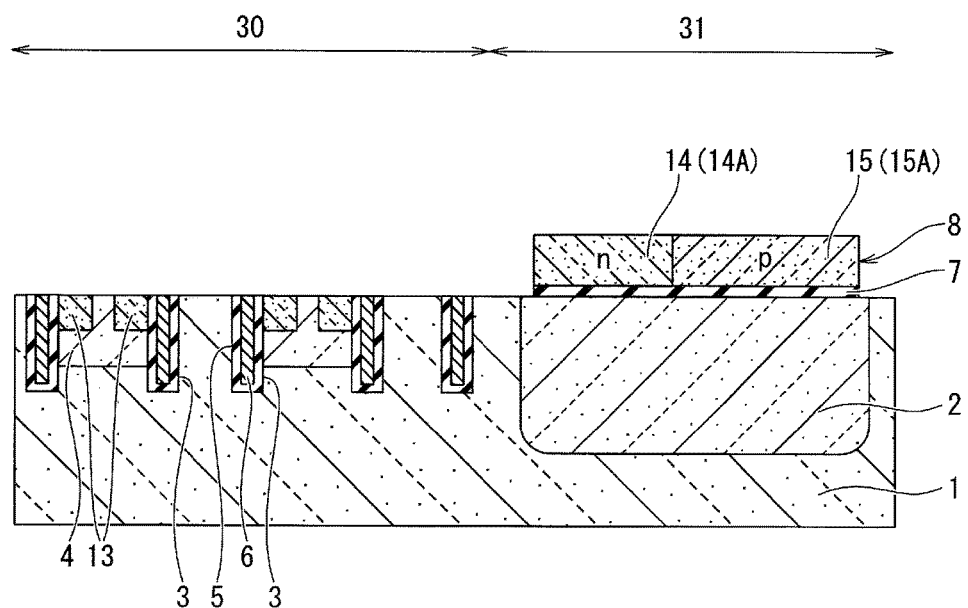
FIG. 13 is a cross-sectional view of the main portion for explaining the method for manufacturing the semiconductor device according to the second embodiment of the present invention.

Next, after the photoresist 11 is removed, heat treatment is performed to activate the impurity ions (arsenic ions $^{75}As^+$) 12 in the impurity ion implantation layers 13n of the active region 30, the impurity ions (arsenic ions $^{75}As^+$) 12 in the impurity ion implantation layer 14n of the polysilicon layer 8, and the impurity ions (boron ions 11B$^+$) 11 in the impurity ion implantation layer 15p, so that the source regions 13 are formed in the active region 30, the cathode region 14A made by the n-type thin-film semiconductor layer 14 including the impurity ions exhibiting the n-type conductivity and the anode region 15A made by the p-type thin-film semiconductor layer 15 including the impurity ions exhibiting the p-type conductivity are formed in the polysilicon layer 8, as illustrated in FIG. 13. In this step, the heat treatment to activate the impurity ions is performed in an atmosphere at a temperature of about 1000° C., for example.

Figure 14:
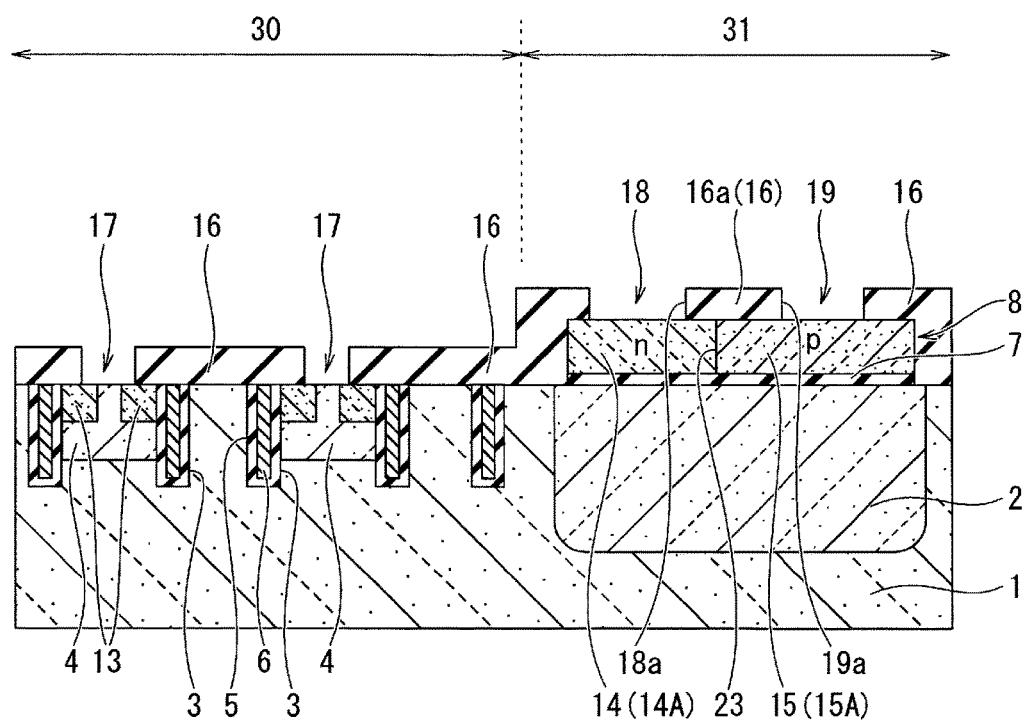
FIG. 14 is a cross-sectional view of the main portion for explaining the method for manufacturing the semiconductor device according to the second embodiment of the present invention.

Next, the interlayer insulating film 16 is formed by CVD, for example, on the entire principal surface of the semiconductor substrate 1 so as to cover the polysilicon layer 8. Thereafter, as illustrated in FIG. 14, the third contact holes 17, which penetrate the interlayer insulating film 16 to partially expose the source regions 13 and channel formation regions 4, the first contact hole 18, which penetrates the interlayer insulating film 16 to partially expose the cathode region, and the second contact hole 19, which penetrates the interlayer insulating film 16 to partially expose the anode region are formed.

Next, on the interlayer insulating film 16, metallic film of Al or Al alloy, for example, is formed by sputtering so as to fill the first contact hole 18, the second contact hole 19 and the third contact hole 17. The metallic film is then patterned to form the cathode electrode 21, the anode electrode 22, and the source electrode 20 as illustrated in FIG. 7. The cathode electrode 21 is electrically and metallurgically connected to the cathode region 14A through the first contact hole 18. The anode electrode 22 is electrically and metallurgically connected to the anode region 15A through the second contact hole 19. The source electrode 20 is electrically and metallurgically connected to the source regions 13 and the channel formation regions 4 through the third contact holes 17. The pn-junction interface 23 at which the p-type anode region 15A is in contact with the n-type cathode region 14A is formed just under the inter-contact hole portion 16a of the interlayer insulating film 16 between the first contact hole 18 and the second contact hole 19.

Thereafter, the first-conductivity type drain region is formed in the back surface of the semiconductor substrate opposite to the principal surface, thus substantially completing the transistor cells 35 implementing the power MOSFET.

At the aforementioned ion implantation, preferably, the dose of the boron ions 9 is about $1\times10^{14}$ cm$^{-2}$ to $5\times10^{14}$ cm$^{-2}$, and the dose of the arsenic 12 is about $1\times10^{15}$ cm$^{-2}$ to $1\times10^{16}$ cm$^{-2}$. When the doses are less than the respective ranges, the resistance values of the regions are excessively high. On the other hand, when the doses are higher than the respective ranges, the concentrations of the impurities are close to the solid-solubility limit of the impurities to silicon and are difficult to control.

Figure 15:
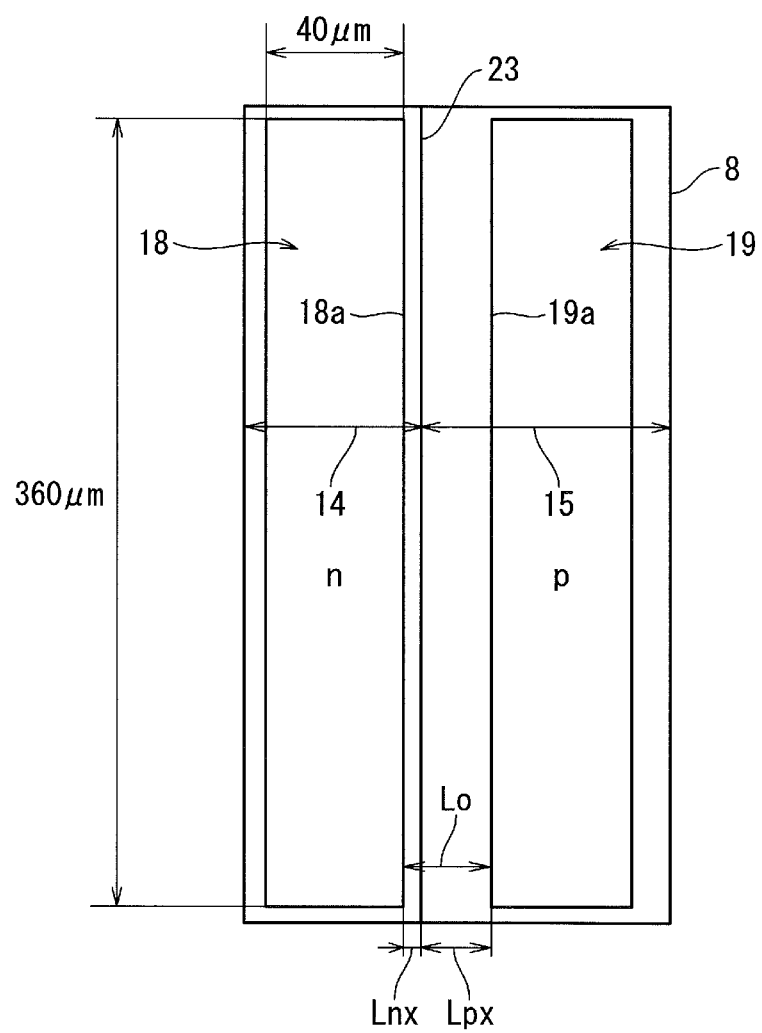
FIG. 15 is a plan view of the main portion illustrating a contact hole formed by the method for manufacturing the semiconductor device according to the second embodiment of the present invention.

FIG. 15 is a plan view of the main portion illustrating contact holes formed by the method for manufacturing the semiconductor device 100B according to the second embodiment of the present invention. The first contact hole 18 and the second contact hole 19 each have a size of 40 μm×360 μm, for example. In this case, the semiconductor device 100B includes one temperature sensing diode 101. However, some semiconductor devices include a plurality of temperature sensing diodes 101 connected in series to increase the detection voltage.

Most of the current I flowing from the anode electrode 22 through the pn-junction interface 23 flows between the first contact hole end 18a and the second contact hole end 19a. Accordingly, the length Lpx of the path of the current flowing in the p-type anode region 15A is equal to the distance between the second contact hole end 19a and the pn-junction interface 23, and the length Lnx of the path of the current flowing in the n-type cathode region 14A is equal to the distance between the first contact hole end 18a and the pn-junction interface 23. Lnx+Lpx=Lo is therefore the distance between the first contact hole end 18a and the second contact hole end 19a and is also the distance between the both ends of the interlayer insulating film 16.

Figure 16:
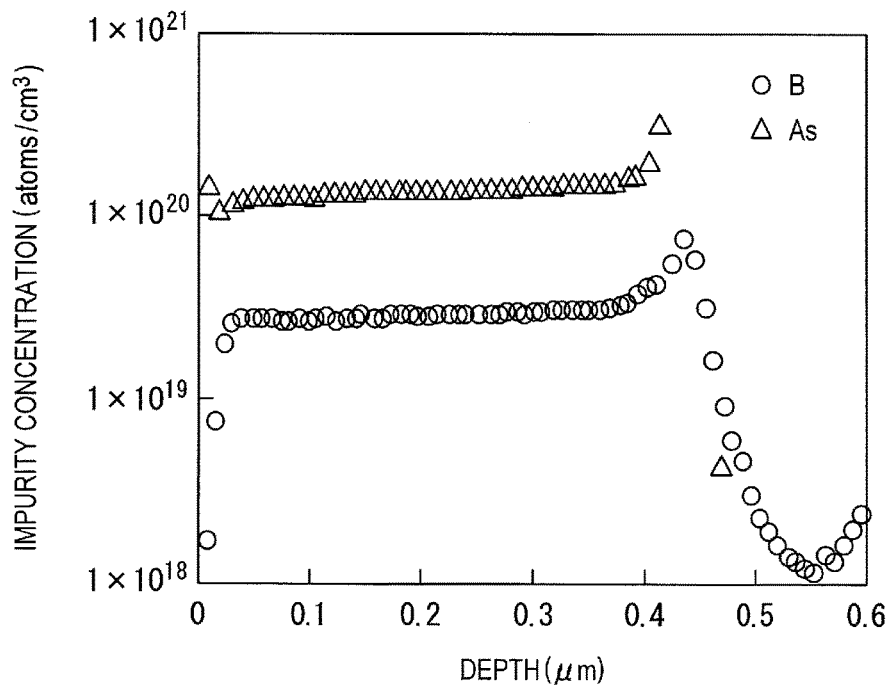
FIG. 16 is a diagram illustrating the relationship between impurity concentration and depth in the semiconductor device according to the second embodiment of the present invention.

FIG. 16 is a diagram illustrating the relationship between the impurity concentration and depth. Herein, the impurity concentration is measured through secondary ion mass spectroscopy (SIMS). The boron concentration is about $2 \times 10^{19}$ $cm^{-3}$, and the arsenic concentration is about $1 \times 10^{20}$ $cm^{-3}$. The resistance value of the n-type cathode region 14A is higher than the resistance value of the p-type anode region 15A although the arsenic concentration is higher than the boron concentration. This is considered to be because the n-type cathode region 14A serves as a compensation-type polysilicon resistor and increases carrier scattering.

Figure 17:
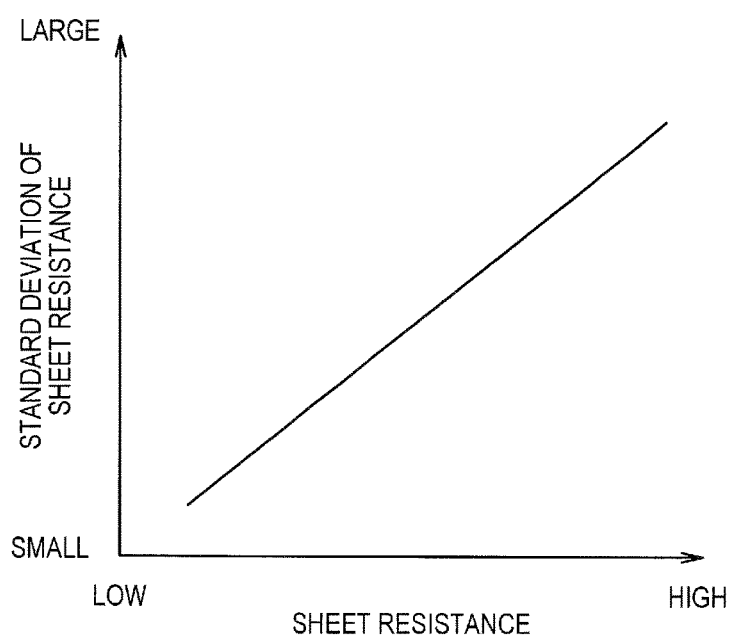
FIG. 17 is a diagram illustrating the relationship between sheet resistance and variation of the semiconductor device according to the second embodiment of the present invention.

FIG. 17 is a diagram illustrating the relationship between the sheet resistance and variation. The diagram illustrates the tendency of the variation to increase with an increase in sheet resistances. Accordingly, when the sheet resistance Rsn of the n-type cathode region 14A is larger than the sheet resistance Rsp of the p-type anode region 15A, the variation of Rsn is larger than the variation of Rsp. Under the aforementioned ion implantation conditions, Rsn is about 400Ω/□, and Rsp is about 150Ω/□ as described above. Herein, the variations are represented by the standard deviations s. The standard deviations s of Rsn and Rsp are about 60 and 1.0, respectively.

As described above, the sheet resistance Rsn of the n-type cathode region 14A is larger than the sheet resistance Rsp of the p-type anode region 15A. In the case of forming the n-type cathode region 14A in a mutual compensation manner, the variation of the sheet resistance Rsn of the n-type cathode region 14A becomes large by the influence of the impurity concentration of the p-type anode region 15A.

Accordingly, by setting Lnx shorter than Lpx so as to decrease the value and variation of Rpnx, the accuracy of temperature detection using Vf of the temperature sensing diode 101 can be improved.

When the step of implanting the boron ions 9 and the step of implanting the arsenic ions 12 are preformed in reverse order or the dose of the arsenic ions 12 is further increased, Rsn<Rsp. In such a case, the value and variation of Vf can be decreased by setting Lpx in a range of 0.1<=Lpx/Lnx<=0.9, thus improving the temperature detection accuracy.

In the above description, the temperature sensing diode 101 is made by one diode. However, the same goes for the case where the temperature sensing diode 101 is made by a plurality of diodes. If a plurality of temperature sensing diode units are connected in series, the variation can be decreased by applying the present invention to each temperature sensing diode unit.

In the above description of the semiconductor device according to the embodiments of the present invention, the semiconductor substrate is made by a silicon semiconductor substrate. However, the present invention is not limited to the thus-configured semiconductor device and also can be applied to a semiconductor device including a semiconductor substrate made of silicon carbide (SiC) or gallium nitride (GaN), for example, as long as each temperature sensing diode in the semiconductor device is made by a thin-film semiconductor layer.

Moreover, in the above description of the semiconductor device according to the embodiments of the present invention, the thin-film semiconductor layer in which the temperature sensing diode is formed is made by a polysilicon layer. However, the present invention is not limited to such a configuration as described in the beginning of the specification and can be applied to a semiconductor device employing an amorphous semiconductor layer, for example.

INDUSTRIAL APPLICABILITY

As described above, the semiconductor device according to the present invention includes a temperature sensing diode with higher temperature detection accuracy. The present invention is therefore useful for semiconductor devices including power devices and temperature sensing diodes, such as intelligent power devices and power ICs.

REFERENCE SIGNS LIST

1 . . . SEMICONDUCTOR SUBSTRATE
2 . . . DIODE PROTECTION REGION
4 . . . CHANNEL FORMATION REGION
3 . . . TRENCH
5 . . . GATE INSULATING FILM
6 . . . GATE ELECTRODE
7 . . . INSULATING FILM
8 . . . POLYSILICON LAYER
9 . . . BORON ION
11 . . . PHOTORESIST
12 . . . ARSENIC ION
13 . . . SOURCE REGION
14 . . . THIN-FILM SEMICONDUCTOR LAYER
14A . . . CATHODE REGION
15 . . . THIN-FILM SEMICONDUCTOR LAYER
15A . . . ANODE REGION
16 . . . INTERLAYER INSULATING FILM
17 . . . THIRD CONTACT HOLE
18 . . . FIRST CONTACT HOLE
18a . . . FIRST CONTACT HOLE END
19 . . . SECOND CONTACT HOLE
19a . . . second contact hole end
20 . . . SOURCE ELECTRODE
21 . . . CATHODE ELECTRODE
22 . . . ANODE ELECTRODE
23 . . . PN-JUNCTION INTERFACE
100A, 100B . . . SEMICONDUCTOR DEVICE
101 . . . TEMPERATURE SENSING DIODE
Rsn . . . SHEET RESISTANCE IN N-TYPE REGION
Rsp . . . SHEET RESISTANCE IN P-TYPE REGION
Ln, Lnx . . . LENGTH OF CURRENT PATH OF CATHODE REGION
Lp, Lpx . . . LENGTH OF CURRENT PATH OF ANODE REGION Rn, Rnx ... RESISTANCE FOR Ln, Lnx
Rp, Rpx ... RESISTANCE FOR Lp, Lpx
Rcn, Rcp ... CONTACT RESISTANCE
Lo ... TOTAL LENGTH OF CURRENT PATHS OF CATHODE AND ANODE REGIONS

The invention claimed is:

1. A semiconductor device, comprising:
a cathode region provided on an insulating film and is made by a first conductivity-type thin-film semiconductor layer;
an anode region provided on the insulating film to form a pn junction with the cathode region and is made by a second conductivity-type thin-film semiconductor layer;
an interlayer insulating film covering the cathode and anode regions;
a cathode electrode provided on the interlayer insulating film and is connected to the cathode region through a first contact hole penetrating the interlayer insulating film; and
an anode electrode provided on the interlayer insulating film and is connected to the anode region through a second contact hole penetrating the interlayer insulating film,
wherein among current paths in the cathode and anode regions, the length of the current path in one of the cathode and anode regions that has a larger sheet resistance is shorter than the length of the other current path, the current path in the cathode region extending from an interface of the pn-junction to an end of the first contact hole closest to the interface, the current path in the anode region extending from the interface to an end of the second contact hole closest to the interface.

2. The semiconductor device of claim 1, wherein the following is satisfied when the sheet resistance of the cathode region is larger than the sheet resistance of the anode region:

$$0.1 <= (Lnx/Lpx) <= 0.9$$

where Lnx and Lpx are the lengths of the current paths in the cathode and anode regions, respectively.

3. The semiconductor device of claim 1, wherein the following is satisfied when the sheet resistance of the cathode region is smaller than the sheet resistance of the anode region:

$$0.1 <= (Lpx/Lnx) <= 0.9$$

where Lnx and Lpx are the lengths of the current paths in the cathode and anode regions, respectively.

4. The semiconductor device of claim 1, wherein the first and second conductivity-type thin-film semiconductor layers are polysilicon layers.

5. A method for manufacturing a semiconductor device, comprising:
implanting first impurity ions into a thin-film semiconductor layer provided on an insulating film;
implanting second impurity ions into a part of the thin-film semiconductor layer with the first impurity ions implanted;
activating the first and second impurity ions to form an anode region in a region with the first impurity ions implanted and form a cathode region in a region with the second impurity ions implanted so as to form a pn junction with the anode region;
forming an interlayer insulating film covering the thin-film semiconductor layer; and
forming a first contact hole penetrating the interlayer insulating film to expose a part of the cathode region and forming a second contact hole penetrating the interlayer insulating film to expose a part of the anode region,
wherein the following is satisfied:

$$0.1 <= (Lnx/Lpx) <= 0.9$$

where Lnx is the length of a current path extending from the interface of a pn junction to an end of the first contact hole closest to the interface and Lpx is the length of a current path extending from the interface to an end of the second contact hole closest to the interface.

6. The method of claim 5, wherein the dose of the first impurity ions is $1 \times 10^{14}$ cm$^{-2}$ to $5 \times 10^{14}$ cm$^{-2}$ and the dose of the second impurity ions is about $1 \times 10^{15}$ cm$^{-2}$ to $1 \times 10^{16}$ cm$^{-2}$.

* * * * *